US010699873B2

(12) United States Patent
Kaneko et al.

(10) Patent No.: US 10,699,873 B2
(45) Date of Patent: Jun. 30, 2020

(54) REFERENCE SAMPLE WITH INCLINED SUPPORT BASE, METHOD FOR EVALUATING SCANNING ELECTRON MICROSCOPE, AND METHOD FOR EVALUATING SIC SUBSTRATE

(71) Applicant: KWANSEI GAKUIN EDUCATIONAL FOUNDATION, Nishinomiya-shi, Hyogo (JP)

(72) Inventors: Tadaaki Kaneko, Sanda (JP); Koji Ashida, Sanda (JP)

(73) Assignee: KWANSEI GAKUIN EDUCATIONAL FOUNDATION, Nishinomiya-shi (JP)

( * ) Notice: Subject to any disclaimer, the term of this patent is extended or adjusted under 35 U.S.C. 154(b) by 0 days.

(21) Appl. No.: 16/096,443

(22) PCT Filed: Apr. 27, 2017

(86) PCT No.: PCT/JP2017/016737
§ 371 (c)(1),
(2) Date: Oct. 25, 2018

(87) PCT Pub. No.: WO2017/188380
PCT Pub. Date: Nov. 2, 2017

(65) Prior Publication Data
US 2019/0148107 A1 May 16, 2019

(30) Foreign Application Priority Data
Apr. 27, 2016 (JP) ................... 2016-089094

(51) Int. Cl.
*H01J 37/26* (2006.01)
*H01J 37/20* (2006.01)
(Continued)

(52) U.S. Cl.
CPC ............. *H01J 37/263* (2013.01); *G01N 1/00* (2013.01); *H01J 37/20* (2013.01); *H01J 37/222* (2013.01);
(Continued)

(58) Field of Classification Search
CPC ...... H01J 37/00; H01J 37/0226; H01J 37/261; H01J 37/263
(Continued)

(56) References Cited

U.S. PATENT DOCUMENTS 6,869,480 B1 * 3/2005 Abel .................. C30B 29/36
117/101
2014/0061455 A1 * 3/2014 Ishii .................. H01J 37/28
250/252.1

FOREIGN PATENT DOCUMENTS

| JP | 2002-352764 A | 12/2002 |
| JP | 2013-235778 A | 11/2013 |
| JP | 2015-179082 A | 10/2015 |

OTHER PUBLICATIONS

International Search Report dated Jul. 18, 2017, issued in counterpart application No. PCT/JP2017/016737 (1 page).

* cited by examiner

*Primary Examiner* — Jason L McCormack
(74) *Attorney, Agent, or Firm* — Westerman, Hattori, Daniels & Adrian, LLP

(57) ABSTRACT

A reference sample (41) has a step/terrace structure made of monocrystalline SiC and a surface of each terrace has first or second stack orientation. In the reference sample (41), contrast as difference in lightness and darkness between an image of a terrace with a surface directly under which the first stack orientation lies and an image of a terrace with a surface directly under which the second stack orientation lies changes according to an incident electron angle which is
(Continued)

an angle that an electron beam emitted from a scanning electron microscope forms with a perpendicular to the terrace surface. Even when a SiC substrate has an off angle (e.g., from 1° to 8°), using an inclined support base (20*a*) capable of correcting the off angle enables sharp contrast that reflects difference between the first and second stack orientations directly under the surface to be obtained irrespective of the off angle.

11 Claims, 12 Drawing Sheets

(51) Int. Cl.
    *H01J 37/28*        (2006.01)
    *G01N 1/00*         (2006.01)
    *H01J 37/22*        (2006.01)

(52) U.S. Cl.
    CPC ....... *H01J 37/28* (2013.01); *H01J 2237/2617* (2013.01); *H01J 2237/2826* (2013.01)

(58) Field of Classification Search
    USPC .......................................... 250/306, 307, 311
    See application file for complete search history.

0° OFF SUBSTRATE (ON SUBSTRATE)    4° OFF SUBSTRATE

REFERENCE SAMPLE WITH INCLINED SUPPORT BASE, METHOD FOR EVALUATING SCANNING ELECTRON MICROSCOPE, AND METHOD FOR EVALUATING SIC SUBSTRATE

TECHNICAL FIELD

The present invention relates mainly to reference samples for evaluating scanning electron microscopes by using contrast in images obtained with the scanning electron microscopes.

BACKGROUND ART

Techniques described in Patent Literature 1 (hereinafter, PTL1) to Patent Literature 3 (hereinafter, PTL3) are known as examples of techniques for performing calibration and evaluation for scanning electron microscopes.

PTL1 discloses techniques for performing calibration and evaluation relating to an energy dispersive X-ray spectroscope of a scanning electron microscope. The X-ray energy calibration is performed by measuring pure metal, such as copper or aluminum. PTL1 discloses techniques that can reduce the number of components by using the pure metal to make a holding member for holding a filter paper, where an object to be tested is collected.

Patent Literature 2 (hereinafter, PTL2) discloses techniques for performing calibration and evaluation for the dimensions of an image obtained with a scanning electron microscope. A reference sample in PTL2 is made up of particles different from each other in dimensions, which are placed on a reference microscale with minute markings. Detailed description of the calibration method is omitted. The foregoing configuration enables facilitated provision for cases where only a reference microscale is insufficient for calibration of dimensions.

PTL3 discloses a reference sample for a scanning electron microscope. This reference sample is made up of a SiC substrate where a step/terrace structure is formed, and light-dark contrast of an SEM image changes according to an incident electron beam angle of the scanning electron microscope.

CITATION LIST

Patent Literature

PTL1: Japanese Patent Application Laid-Open No. 2013-235778
PTL2: Japanese Patent Application Laid-Open No. 2002-352764
PTL3: Japanese Patent Application Laid-Open No. 2015-179082

SUMMARY OF INVENTION

Technical Problem

In addition to the matters mentioned in PTL1 to PTL3 described above, the quality of an emitted electron beam is also included in the performance of a scanning electron microscope. If, for example, an emitted electron beam lacks parallelism or an electron beam to an object to be tested fails to be emitted in a predetermined direction, no desired image may be obtained.

However, methods for evaluating such electron beams have been nonexistent heretofore and it was impossible to evaluate the quality of a scanning electron microscope objectively. Further, PTL3 describes that, with a reference sample made up of a SiC substrate having a large off angle, it is difficult to observe light-dark contrast in an SEM image.

Aspects of the present invention have been made in view of the foregoing circumstances and are aimed mainly at providing a configuration that enables a reference sample for objectively evaluating the quality of a scanning electron microscope to deliver performance even when an off angle is large.

Solution to Problem and Advantageous Effects of Invention

While the problems that the present invention attempts to solve are described above, solutions for solving the problems and advantageous effects thereof are described below.

A first aspect of the present invention provides a reference sample with an inclined support base, which is configured as described below. That is, the reference sample with the inclined support base includes: a scanning electron microscope reference sample for evaluating performance of a scanning electron microscope; and an inclined support base that supports the scanning electron microscope reference sample. The scanning electron microscope reference sample is made of a hexagonal SiC single crystal, has an off angle, and has a step/terrace structure including a step with a half unit height and a terrace even in an atomic level, the step/terrace structure being formed on a surface of the scanning electron microscope reference sample. Molecular layer orientations under surfaces of terraces located with a step present therebetween are either first or second stack orientations that satisfy a mutually reversal relation and that satisfy three-fold symmetry when viewed from {0001} surface. A support surface of the inclined support base has an inclination angle identical to an off angle of the scanning electron microscope reference sample. Contrast as difference in lightness and darkness between an image of the terrace with a surface directly under which the first stack orientation lies and an image of the terrace with a surface directly under which the second stack orientation lies changes according to an incident electron angle irrespective of the off angle of the scanning electron microscope reference sample, where the incident electron angle is an angle that an electron beam emitted from the scanning electron microscope forms with respect to a perpendicular to the surface of the terrace.

Since the stack orientation directly under the surface of the scanning electron microscope reference sample (hereinafter, the reference sample) represents a physical property value of the hexagonal SiC single crystal, contrast that can be observed is identical if incident conditions for an electron beam (including an incident electron angle, acceleration voltage, and the like) are identical. Thus, a scanning electron microscope can be evaluated objectively by determining contrast with a high-precision scanning electron microscope in advance, for example, and comparing the contrast with contrast obtained with a scanning electron microscope to be evaluated. Further, SiC suffers few constraints on usage environment because of excellence in its resistance to heat and to oxidation and thus, a reference sample usable for a long period can be achieved. Moreover, use of the inclined support base enables sharp contrast to be observed even with a reference sample having an off angle, which can therefore be employed as a reference sample.

In the reference sample with inclined support base, it is preferable that the contrast be highest when the incident electron angle is in a range from 30° to 40°. The angle that provides the highest contrast depends on whether the surface is Si or C, and 4H or 6H, and has a value peculiar to each case.

Since the two stack orientations represent physical property values, an incident electron angle that provides the highest contrast can be determined in advance. Thus, by determining an incident electron angle that provides the highest contrast based on an image obtained with a scanning electron microscope to be evaluated and comparing the determined incident electron angle against the incident electron angle determined in advance, the scanning electron microscope can be evaluated.

In the reference sample with inclined support base, it is preferable that the contrast change according to a sample rotation angle and the change satisfy the three-fold symmetry exhibited by the first and second stack orientations that appear on hexagonal SiC single-crystalline {0001} surface, where the sample rotation angle is an angle by which the scanning electron microscope reference sample is rotated about a perpendicular to the surface of the terrace.

Accordingly, data acquired as described above are unique to reference samples and thus, use of such various data enables a scanning electron microscope to be evaluated in more detail. In particular, while it was conventionally difficult to observe three-fold symmetry in a reference sample (SiC substrate) having an off angle, use of an inclined support base enables three-fold symmetry to be observed.

In the reference sample with inclined support base, the reference sample with inclined support base may have a step/terrace structure in the shape of concentric circles or similar hexagons and each height of the steps that make up the structure may correspond to half of a stack period of a SiC crystal, which is 0.5 nm (corresponding to a two-molecular layer) in a case of 4H—SiC or is 0.75 nm (corresponding to a three-molecular layer) in a case of 6H—SiC.

In the reference sample with inclined support base, it is preferable that a terrace width be 0.1 µm or more and 20 µm or less.

Thus, observation can be performed without largely reducing the diameter of an electron beam. Accordingly, the acceleration voltage of an electron beam need not be raised largely and the stack orientations directly under the surface, instead of those inside the terrace, can be observed intensively. As a result, contrast can be made sharp.

In the reference sample with inclined support base, it is preferable that the step/terrace structure be made by: forming a depression in (0001) Si surface or (000-1) C surface of a surface of a 4H—SiC or 6H—SiC substrate having an off angle; heating the SiC substrate under Si vapor pressure; and removing a surface layer by 10 µm or more for example.

In the reference sample manufactured in this manner, unlike ones manufactured by other methods, the thickness of the surface layer removed is, for example, 10 µm or more, and therefore a distortion region likely to remain on the SiC surface is removed, such that even an atomic arrangement near the surface is very uniform and an intrinsic stack orientation of a SiC crystal is accurately reflected. As a result, contrast can be observed clearly.

A second aspect of the present invention provides a method for evaluating performance relating to parallelism and a direction of an electron beam that a scanning electron microscope emits, the evaluation being implemented by comparing change in the contrast obtained by an electron beam being emitted to the reference sample with the inclined support base while an incident electron angle is changed against change in contrast determined in advance.

Accordingly, objective evaluation of a scanning electron microscope is enabled, which was impossible conventionally.

In the method for evaluating the scanning electron microscope, it is preferable that performance relating to a depth of an electron beam that the scanning electron microscope emits be evaluated by comparing an image obtained by an electron beam being emitted from the scanning electron microscope to the scanning electron microscope reference sample made of 4H—SiC, where the stack orientation turns at a depth corresponding to a two-molecular layer (0.5 nm) from the surface, against an image obtained by an electron beam being emitted from the scanning electron microscope to the scanning electron microscope reference sample made of 6H—SiC, where the stack orientation turns at a depth corresponding to a three-molecular layer (0.75 nm) from the surface.

In 6H—SiC, the level at which the stack orientation turns directly under the surface is deeper by one molecular layer (0.25 nm) than that in 4H—SiC and thus, information on the depth where an electron beam that a scanning electron microscope emits enters can be evaluated.

A third aspect of the present invention provides a method for evaluating quality of a SiC substrate by comparing contrast obtained by an electron beam being emitted from a scanning electron microscope to the reference sample with the inclined support base against contrast obtained by an electron beam being emitted to a SiC substrate to be evaluated.

Accordingly, evenness and uniformity of a surface of a SiC substrate can be evaluated objectively.

In the method for evaluating the SiC substrate, it is preferable that quality of a SiC substrate be evaluated by comparing in-plane distribution of brightness that is obtained by an electron beam being emitted from a scanning electron microscope to the scanning electron microscope reference sample at a predetermined incident electron angle and that is obtained from terraces with surfaces directly under which a first stack orientation and a second stack orientation lie against in-plane distribution of brightness that is obtained by an electron beam being emitted to a SiC substrate to be evaluated at an incident electron angle identical to the incident electron angle.

If the SiC substrate has a large cutout angle (off angle α) of the SiC substrate (which is in the range from 1° to 8° for example), {0001} surface is positioned to be inclined with respect to the surface of the SiC substrate by the off angle α and the terrace length is very short, and thus sharp contrast fails to be observed under observation conditions identical to those for a SiC substrate (an on substrate) with an off angle of approximately 0°. However, contrast is greatly increased by employing the above-described support base and performing pseudo correction on the off angle and accordingly, the quality of a SiC substrate can be evaluated using in-plane distribution of brightness.

DESCRIPTION OF EMBODIMENTS

Embodiments of the present invention are described below with reference to the drawings.

Figure 1:
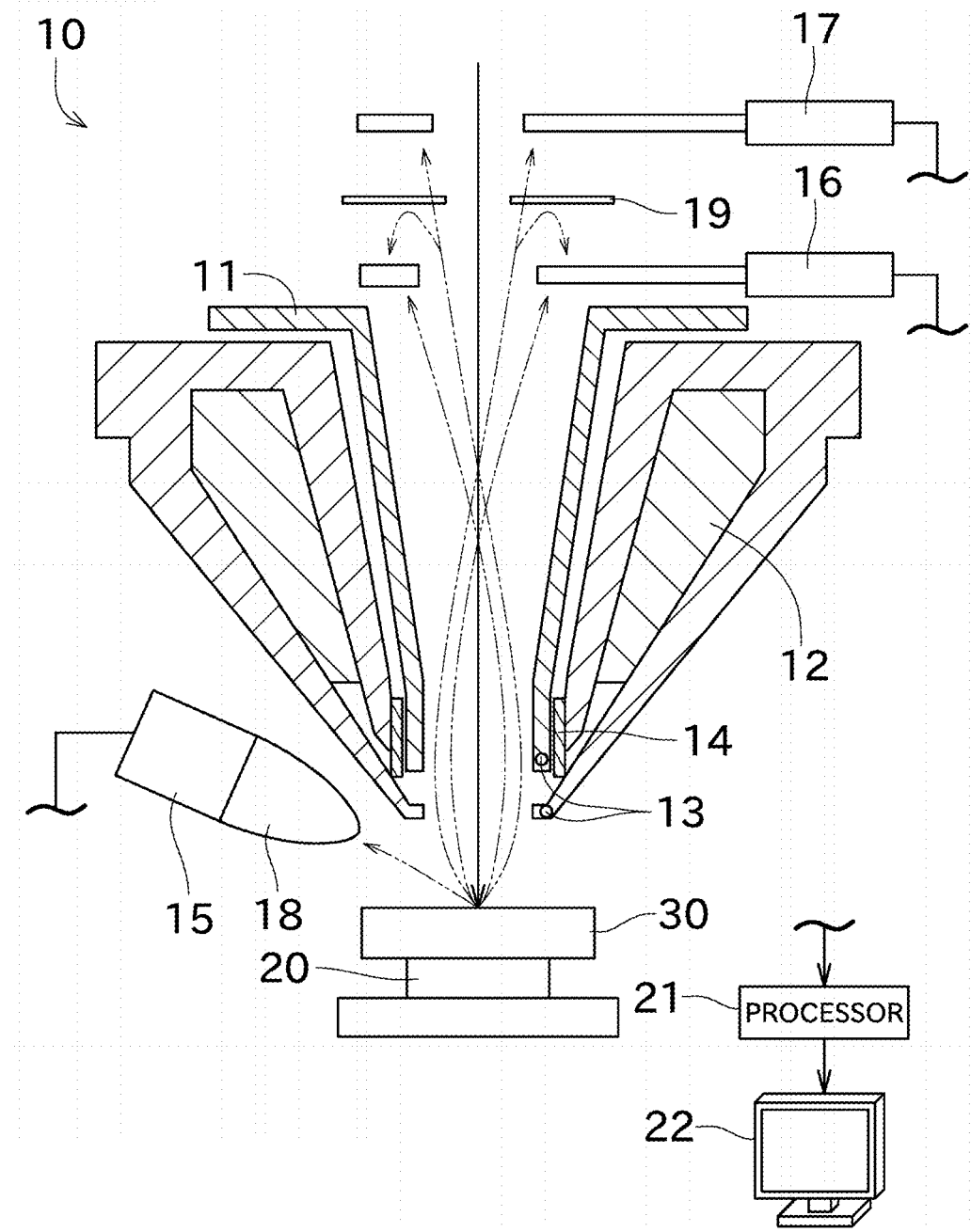
FIG. 1 is a schematic cross-sectional view illustrating a typical observation method using a scanning electron microscope.

First, a configuration of a scanning electron microscope is briefly described with reference to FIG. 1. As illustrated in FIG. 1, a scanning electron microscope 10 includes a beam booster 11, an electromagnetic lens 12, an electrostatic lens 13, and a scan coil 14.

An electron beam emitted from an electron emission unit of the scanning electron microscope 10 is accelerated by the beam booster 11 and focused through the electromagnetic lens 12 and the electrostatic lens 13 to be incident on an object 30 to be tested. The scan coil 14 can change the direction of an electron beam using a magnetic field that the scan coil 14 generates. Thus, a surface of the object 30 to be tested can be scanned with an electron beam.

The scanning electron microscope 10 further includes an SE2 detector 15, an in-lens detector 16, a reflected electron detector 17, a collector grid 18, and a filtering grid 19.

The SE2 detector 15 and the in-lens detector 16 detect both a reflected electron which is an electron that is emitted after an electron beam (primary electron) radiated by the scanning electron microscope 10 is repelled by a surface of an object to be tested or interacts with the object to be tested and an electron (secondary electron) that is generated in the course of interaction. The collector grid 18 collects electrons systematically and the filtering grid 19 determines a lower limit of energy of electrons allowed to pass. The reflected electron detector 17 has a characteristic of detecting only electrons that have passed through the filtering grid 19.

The object 30 to be tested is placed on a support base (stub) 20.

Detection results obtained by the SE2 detector 15, the in-lens detector 16, and the reflected electron detector 17 are output to a processor 21. The processor 21 creates a scanning electron micrograph (SEM image) based on a position of the object 30 to be tested and electrons detected at the position. The processor 21 outputs the created scanning electron micrograph to a display 22. The display 22 displays the received scanning electron micrograph.

A reference sample for evaluating a scanning electron microscope and a SiC substrate is described below.

Figure 2:
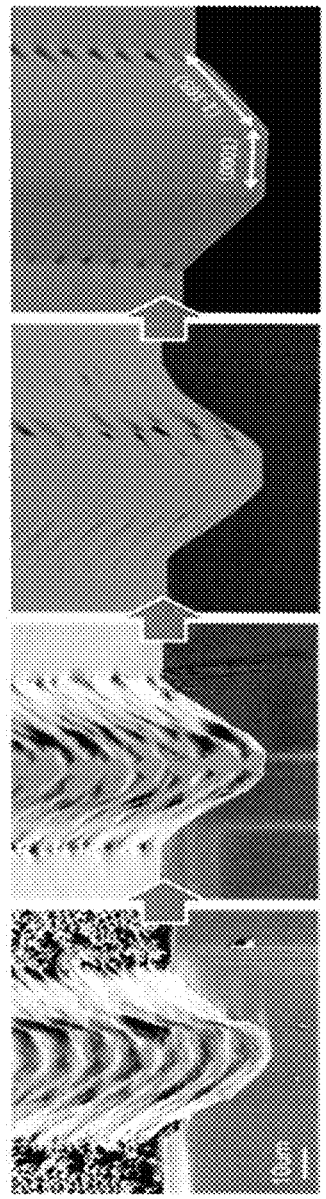
FIG. 2 is a diagram showing a process of producing a grooved reference sample.
Figure 2:
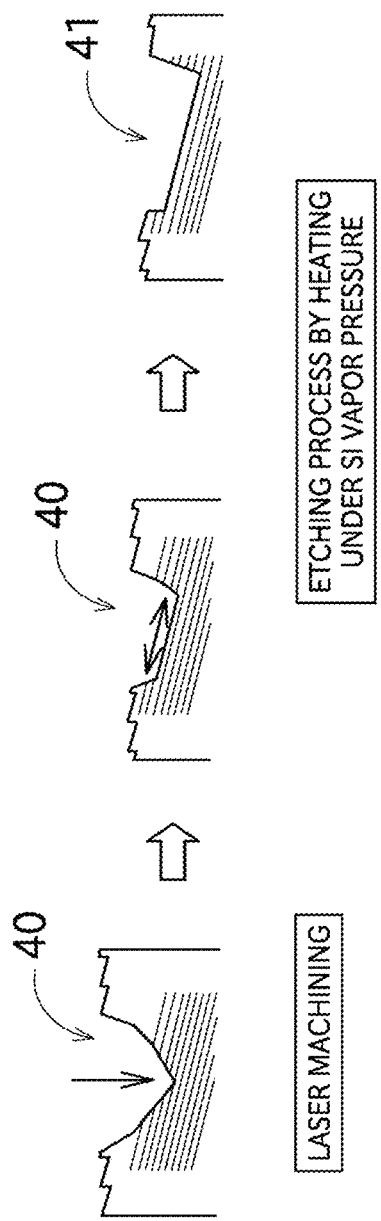
Figure 3:
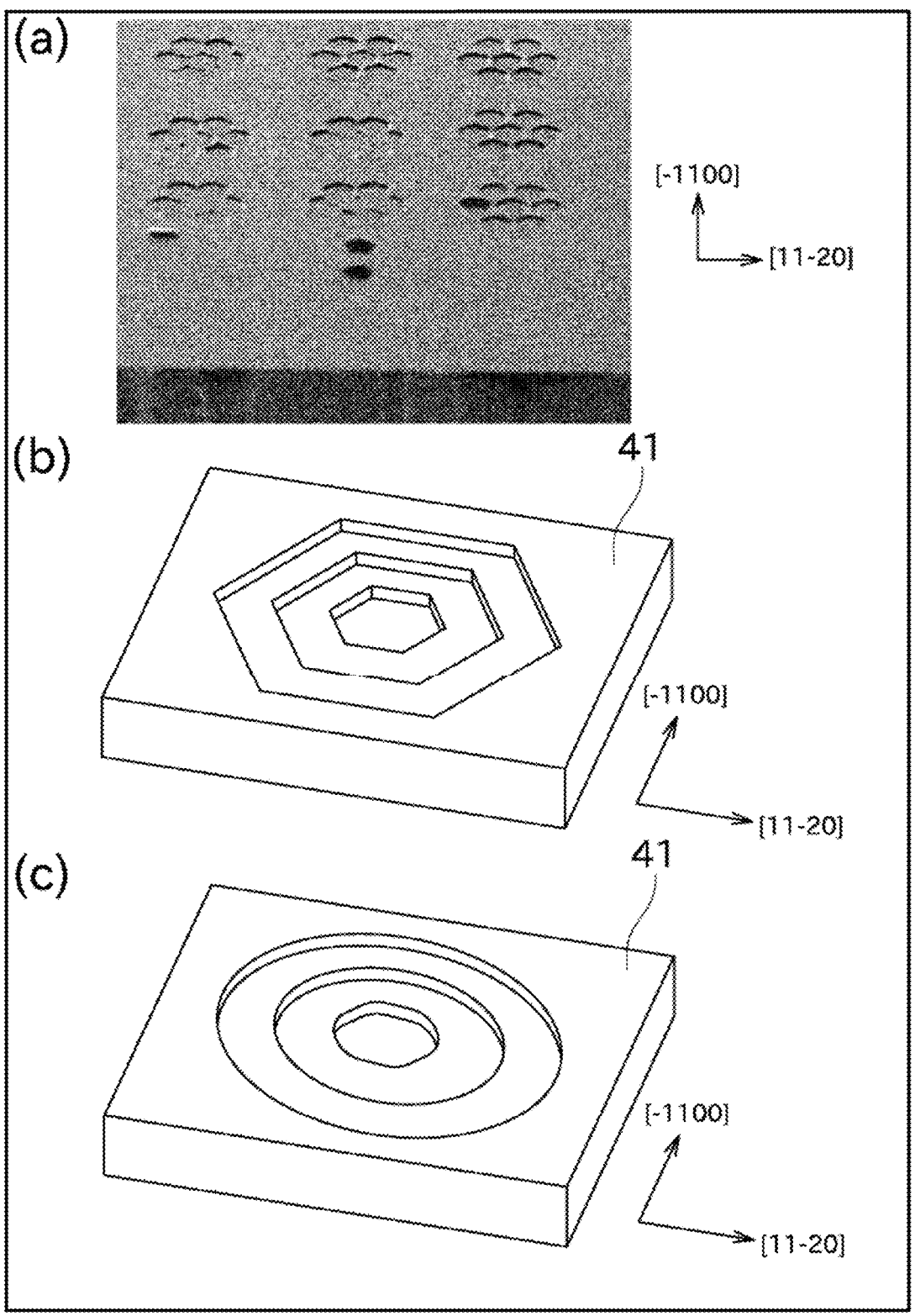
FIG. 3 is a diagram showing reference samples in the shapes of similar hexagons and concentric circles.

First, a method for manufacturing a reference sample 41 is described with reference to FIGS. 2 and 3. FIG. 2 is a diagram showing a process of producing the reference sample 41, which is grooved. FIG. 3 is a diagram showing the reference sample 41, which is in the shape of concentric circles and similar hexagons.

To manufacture the grooved reference sample 41, firstly, a groove is formed in a SiC substrate 40 by, for example, irradiating the SiC substrate 40 with a laser. After that, the SiC substrate 40 where the groove is formed is heated in a temperature range from 1600° C. to 2100° C. under Si vapor pressure.

Through the heat treatment, SiC in the SiC substrate 40 thermally sublimates in the form of $Si_2C$ or $SiC_2$ and {0001} surface, which is the most stable surface of the hexagonal SiC single crystal, is formed spontaneously and the SiC substrate 40 is planarized. Thus, while the surface of the SiC substrate 40 undergoes etching, the surface can be planarized in an atomic level. As a result, a step/terrace structure made up of steps that each have a height corresponding to half of a stack period and terraces that are even in an atomic level is formed as illustrated in FIG. 5(a), which is described later.

To manufacture the reference sample 41 in the shape of similar hexagons (FIG. 3(b)) and the reference sample 41 in the shape of concentric circles (FIG. 3(c)), the SiC substrate is irradiated with laser beams to form depressions as illustrated in FIG. 3(a). After that, the heat treatment (etching) is performed in the same manner as described above. At this time, when dislocation (such as threading edge dislocation) is present on the bottom surface of the depression, the reference sample 41 that is in the shape of similar hexagons or concentric circles is formed outward from the dislocation serving as the center. This reference sample 41 also includes a step/terrace structure made up of steps that each have a (half unit) height corresponding to half of a stack period and terraces that are even in an atomic level as illustrated in FIG. 5(a) described later.

To manufacture the reference sample 41 with a predetermined off angle, for example, an ingot is cut in a direction inclined by the predetermined off angle relative to <11-20> direction or <-1100> direction. After that, it is just required to perform the above-described processes on the SiC substrate 40 obtained as a result of the cutting of the ingot.

A configuration of the reference sample 41 manufactured in the foregoing manner is described below with reference to FIGS. 4 and 5.

First, a half unit height and a molecular arrangement are described with reference to FIG. 4. FIG. 4 is a schematic diagram illustrating molecular arrangements and periods of 4H—SiC and 6H—SiC. The surface of the SiC substrate 40 is planarized by performing the etching as described above and terminated at a step having a half unit height, which corresponds to half of the stack period of 4H—SiC and 6H—SiC.

The "half unit height" indicates the height of stacking at half of the period described above. Thus, the half unit height of 4H—SiC corresponds to a two-molecular layer (0.50 nm) as illustrated in FIG. 4(a). The half unit height of 6H—SiC corresponds to a three-molecular layer (0.75 nm) as illustrated in FIG. 4(b).

Figure 4:
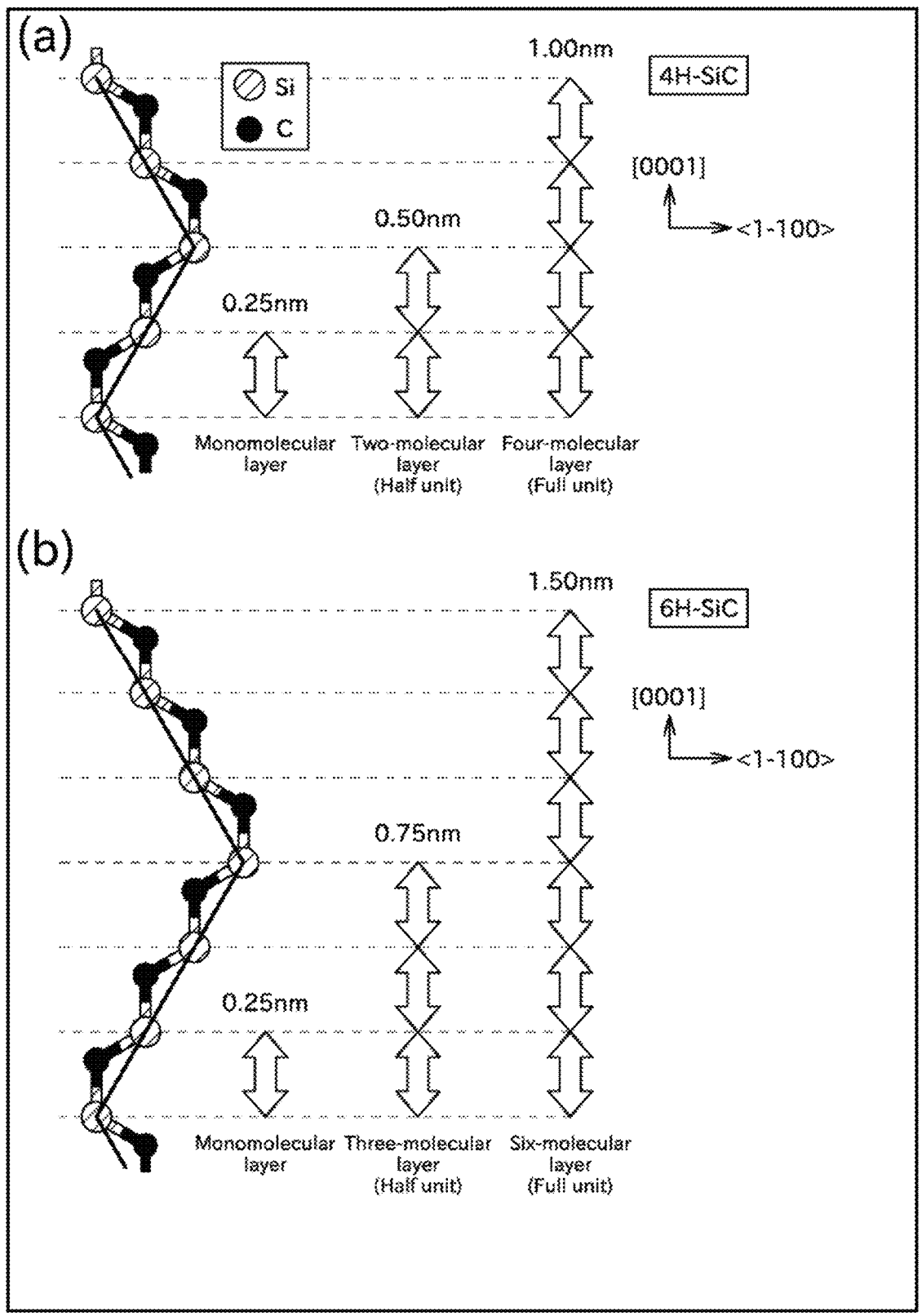
FIG. 4 is a schematic diagram illustrating molecular arrangements and periods of 4H—SiC and 6H—SiC.

As illustrated in FIG. 4, a hexagonal SiC monocrystalline substrate has a configuration where a stack orientation (a direction in which molecular layers of Si—C are stacked) turns every half period between <1-100> direction and the opposite direction thereof. In a case of 4H—SiC, an Si-atom stack orientation is reversed by every 2L, where L represents the interval between Si—C pairs (see the thick line in FIG. 4(a)). A C-atom stack orientation is also reversed by every 2L, though a thick line indicative thereof is not shown.

When spacing between atoms in 6H—SiC is denoted as L, the stack orientation of the Si atoms is reversed at every 3L (see the thick line in FIG. 4(b)). Although not indicated with a thick line, the stack orientation of the C atoms is reversed similarly at every 3L. Thus, there are two stack orientations, one of which corresponds to a first stack orientation while the other corresponds to a second stack orientation.

Figure 5:
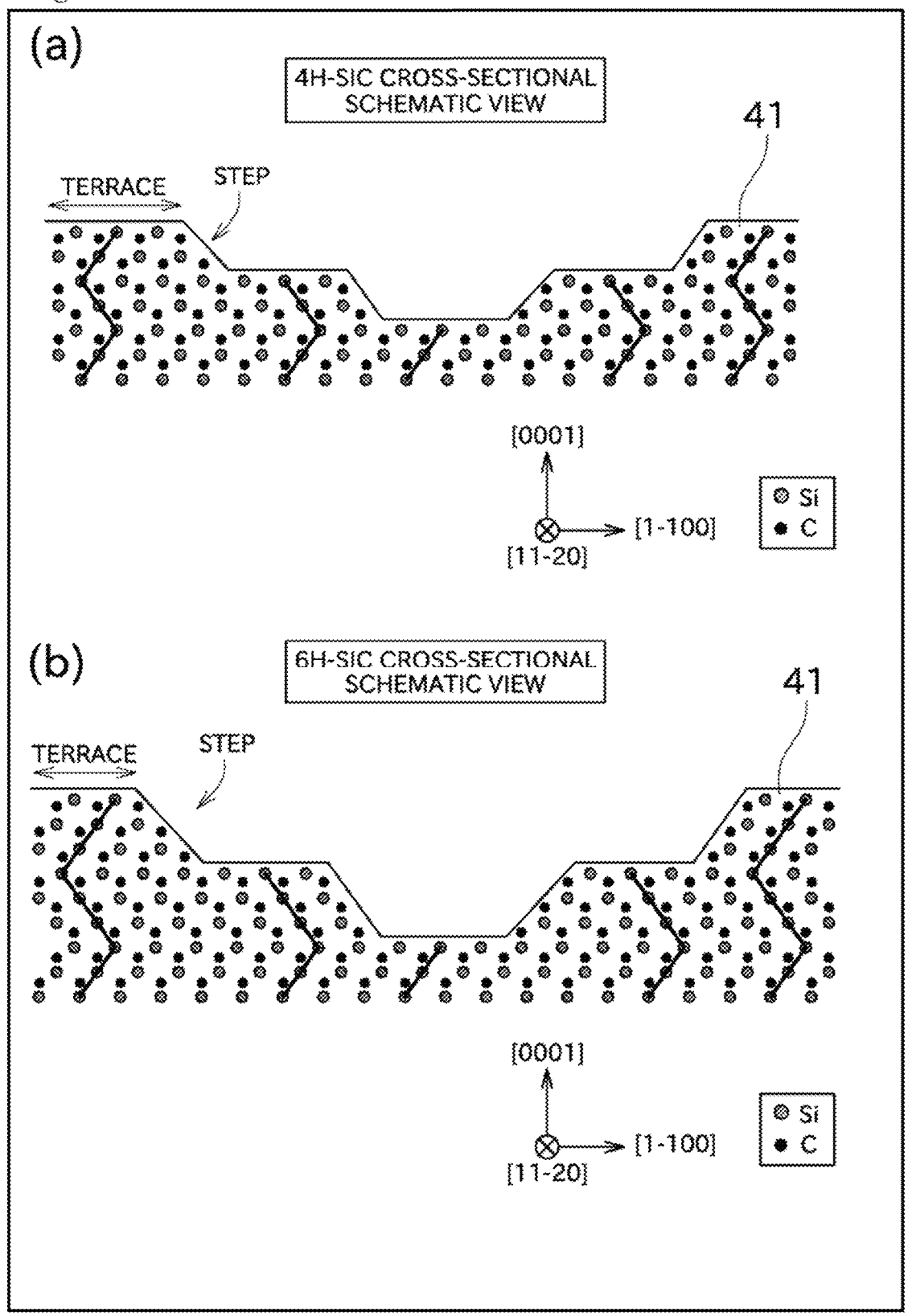
FIG. 5 is schematic cross-sectional views of surfaces of reference samples made of 4H—SiC and 6H—SiC.

FIG. 5 presents schematic cross-sectional views of surfaces of reference samples made of 4H—SiC and 6H—SiC. The reference sample 41 in FIG. 5(a) is made of 4H—SiC while the reference sample 41 in FIG. 5(b) is made of 6H—SiC.

As illustrated in FIG. 5, the reference sample 41 according to the present embodiment has a step/terrace structure. The step/terrace structure as used herein includes differences in height, among which even portions are each referred to as a terrace and height difference portions where the height changes are each referred to as a step. A step height equals a half unit height or a full unit height in molecular stacking, irrespective of an off angle. Thus, a terrace length decreases as the off angle increases, and the terrace length increases as the off angle decreases. Although a terrace width is depicted to correspond to a few atoms or so in FIG. 5 for ease of understanding, an actual terrace width is very large and in the range from approximately 0.1 μm to 20 μm for example.

Each step is terminated at the above-described half unit height. Thus, terraces that are adjacent with a step present therebetween satisfy a relation where the stack orientations directly under the surfaces of the terraces are mutually reversed (see the thick lines in FIG. 5). A scanning electron microscope and a SiC substrate can be evaluated by effectively utilizing this characteristic of the reference sample 41. Monocrystalline Si typically used as a sample for height calibration exhibits no change in stack orientation directly under the surface because of its diamond structure, and thus does not have such a characteristic and differs from the reference sample 41 according to the present embodiment in configuration and properties.

Figure 6:
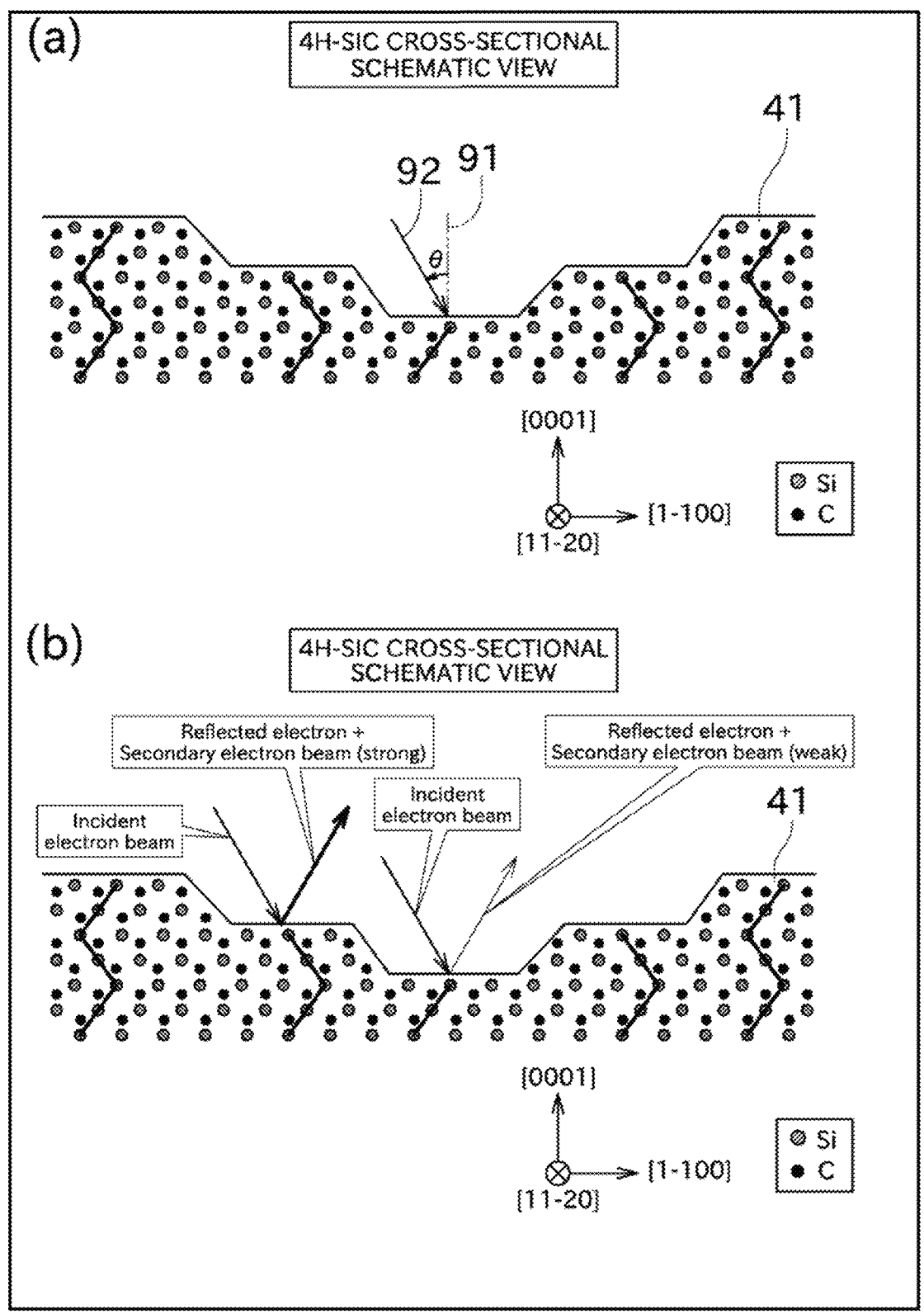
FIG. 6 is a view illustrating an incident electron angle θ of an electron beam and a view showing a relation of stack orientations to emission of reflected electrons and secondary electrons.

The properties of the reference sample 41 are described below. First, the properties that the reference sample 41 exhibits when an electron beam is radiated to the reference sample 41 not perpendicularly but with an inclination are described with reference to FIGS. 6 and 7. In the description below, the reference sample 41 having the step/terrace structure in the shape of concentric circles illustrated in FIG. 3(c) is employed.

Described now is a variation of scanning micrographs of (0001) surface of 4H—SiC, which are obtained according to an incident electron angle θ. The incident electron angle θ as used herein indicates the angle by which, as illustrated in FIG. 6(a), an electron beam irradiation direction 92 is inclined with respect to a perpendicular 91 to the surface of the reference sample 41 when viewed from a side. When the surface is (0001) Si surface, the incident electron angle θ can also be expressed as an inclination angle toward <1-100> direction or the opposite direction thereof.

Figure 7:
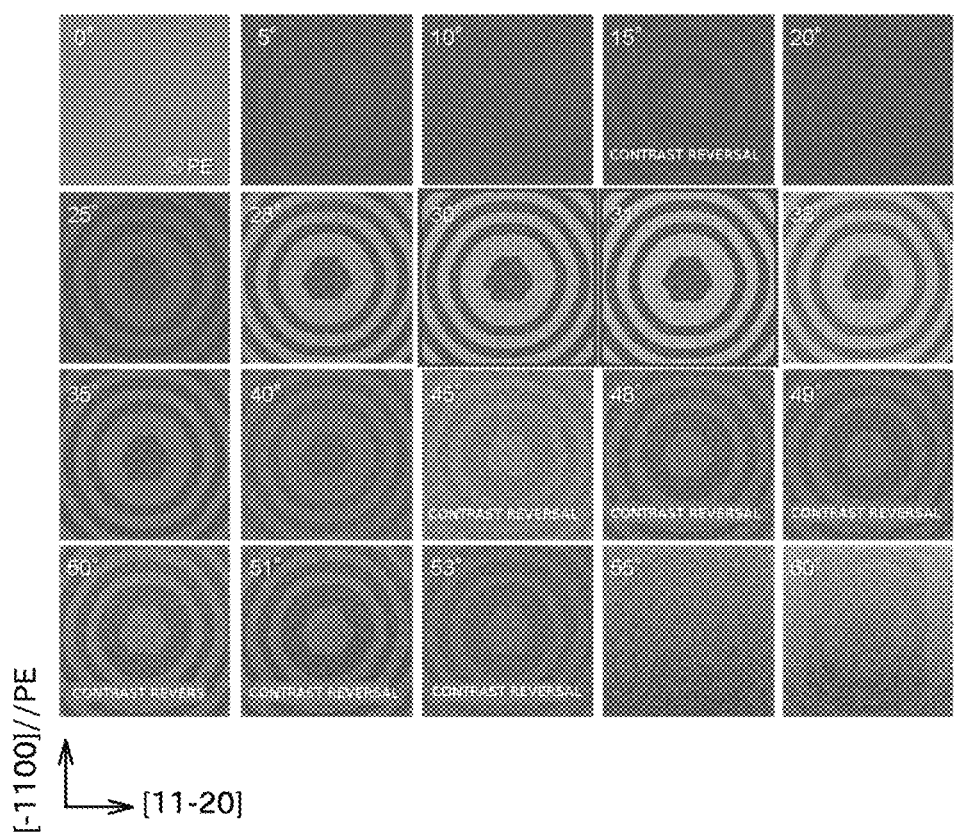
FIG. 7 is micrographs showing change in contrast with change in the incident electron angle θ of an electron beam.

FIG. 7 presents micrographs (reflected electrons+secondary electron images) that indicate change in contrast when the incident electron angle θ of an electron beam is changed while the acceleration voltage is 1.0 kV. The numerals in the upper left corners in FIG. 7 each indicate the incident electron angle θ. When the incident electron angle θ is 0°, no step/terrace structure is visible on the surface of the reference sample 41. It is found that when the incident electron angle θ is increased, morphology in the shape of concentric circles appears. The morphology can be classified into two regions, namely, light regions and dark regions, and boundaries between the two regions agree with positions of the steps.

As described above, in 4H—SiC, two terraces located with a step present therebetween, which has a half unit height (0.5 nm), satisfy a relation where the stack orientations directly under the surfaces of the terraces are mutually reversed. Thus, the light-dark contrast that appears on the scanning micrographs reflects the reversal in stack orientation directly under the surface, on 4H—SiC (0001) terrace surfaces. This light-dark contrast changes according to the incident electron angle θ and the acceleration voltage. Specifically, if the acceleration voltage is 1 kV, the contrast increases as the incident electron angle θ is increased and when the incident electron angle θ is between 30° and 31°, the contrast is highest. As the incident electron angle θ is further increased after that, the contrast decreases again and when the incident electron angle θ is between 42° and 43°, the contrast is reversed (the light regions and the dark regions are interchanged). Then, the contrast increases with further increase in the incident electron angle θ, and when the incident electron angle θ is between 55° and 57°, the contrast is reversed again and returns to the original state, and then very low contrast is exhibited.

The above reveals that there is a rough tendency that a reflected electron beam and a secondary electron beam have a higher intensity when an angle difference between an incident electron beam and the stack orientation directly under a terrace surface is smaller, as illustrated in FIG. 6(b). The above also reveals that there is a rough tendency that a reflected electron beam and a secondary electron beam have a lower intensity when an angle difference between an incident electron beam and the stack orientation directly under a terrace surface is greater.

The contrast that reflects the stack orientations directly under the surface as described above is similar to what can be brought by the channeling effect of electron beams. The acceleration voltage in this example, however, is 1.0 kV or less and channeling contrast brought solely by the outermost layer of a monocrystalline sample in a region where electron beams undergo such a low acceleration has been unknown to date.

Next, properties that the reference sample 41 exhibits when the reference sample 41 is rotated in a horizontal direction are described with reference to FIG. 8. As illustrated in FIG. 8(a), the angle by which the reference sample 41 is rotated about the perpendicular 91 to the surface is referred to as a sample rotation angle φ. FIG. 8(b) presents scanning micrographs obtained when the sample rotation angle φ is changed with the incident electron angle θ of 30° and the acceleration voltage of 0.40 kV. FIG. 8(c) illustrates directions in which electrons are incident and molecular arrangements in cases of the sample rotation angle φ being 0°, 30°, and 60°. In the cases of φ=0° and 60°, the incident electrons are incident in parallel to <1-100> direction, which is parallel to the stack orientations of 4H—SiC, and the stack orientations relative to incidence of the incident electrons are mutually reversed. In the case of φ=30°, the incident electrons are incident in parallel to <11-20> direction, and the stack orientations under the 4H—SiC surface has no characteristic in relation to the incident electrons.

Figure 8:
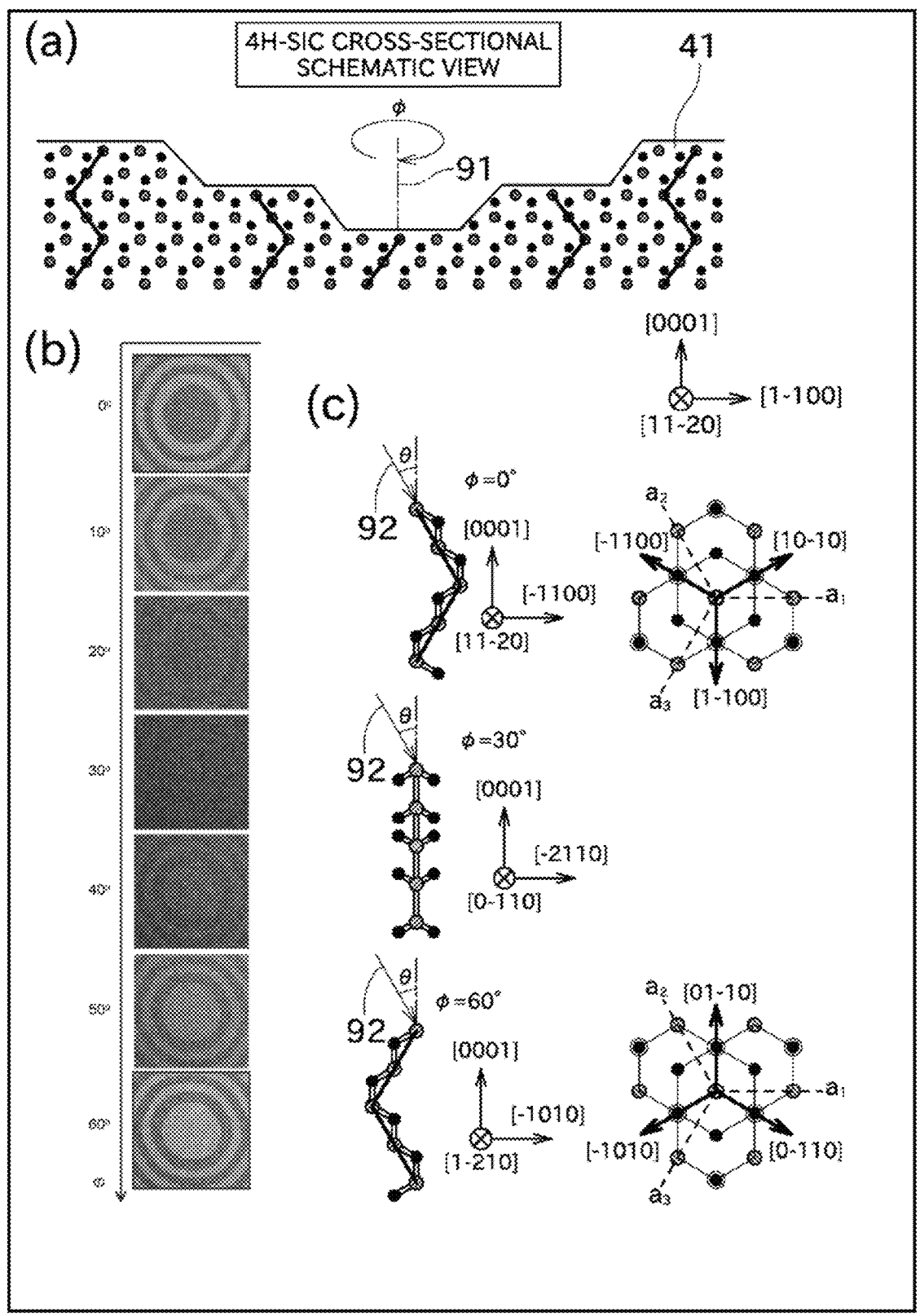
FIG. 8 is a view illustrating a sample rotation angle, a diagram showing change in contrast with change in the sample rotation angle, and a diagram showing molecular arrangements with change in the sample rotation angle.

FIG. 8 (b) demonstrates that morphology in the shape of concentric circles having clear light-dark contrast appears when φ=0° and that colors are reversed in the order of dark, light, dark, . . . from the center while the steps with a two-molecular layer height (0.5 nm) corresponding to a half unit of 4H—SiC serving as boundaries. Then, as the sample rotation angle φ increases gradually, the light-dark contrast becomes weaker and when φ=30°, the contrast disappears. When the sample is further rotated until the sample rotation angle φ becomes 40°, light-dark contrast appears again. It is found here that the contrast is reversed from the one obtained when φ=0°. The contrast that appears again in the reversed state when φ=40° is enhanced by further rotating the reference sample 41, and when φ=60°, the contrast reaches a maximum while maintaining the reversed state.

Although not illustrated in FIG. 8(b), the light-dark contrast reaches a maximum again when φ=120°, 180°, 240°, 300°, and 360°, and the contrast is reversed when φ=180° and 300° among the aforementioned angles. That is, 60° rotation makes the contrast reversed and 120° rotation makes the contrast identical. Thus, it can be seen that the contrast exhibits three-fold symmetry of 4H—SiC (0001) and reflects the stack orientations directly under the surface.

Influence exerted by a difference in the depth direction of the reference sample 41 is described below with reference to FIG. 9. Specifically, 4H—SiC and 6H—SiC where a layer turns in a position deeper than that in 4H—SiC by one molecular layer (0.25 nm) were observed. The scanning micrographs in FIG. 9 were taken in the observation with the acceleration voltage of 1.0 kV, the incident electron angle θ of 31°, and the sample rotation angle φ of 0°.

Figure 9:
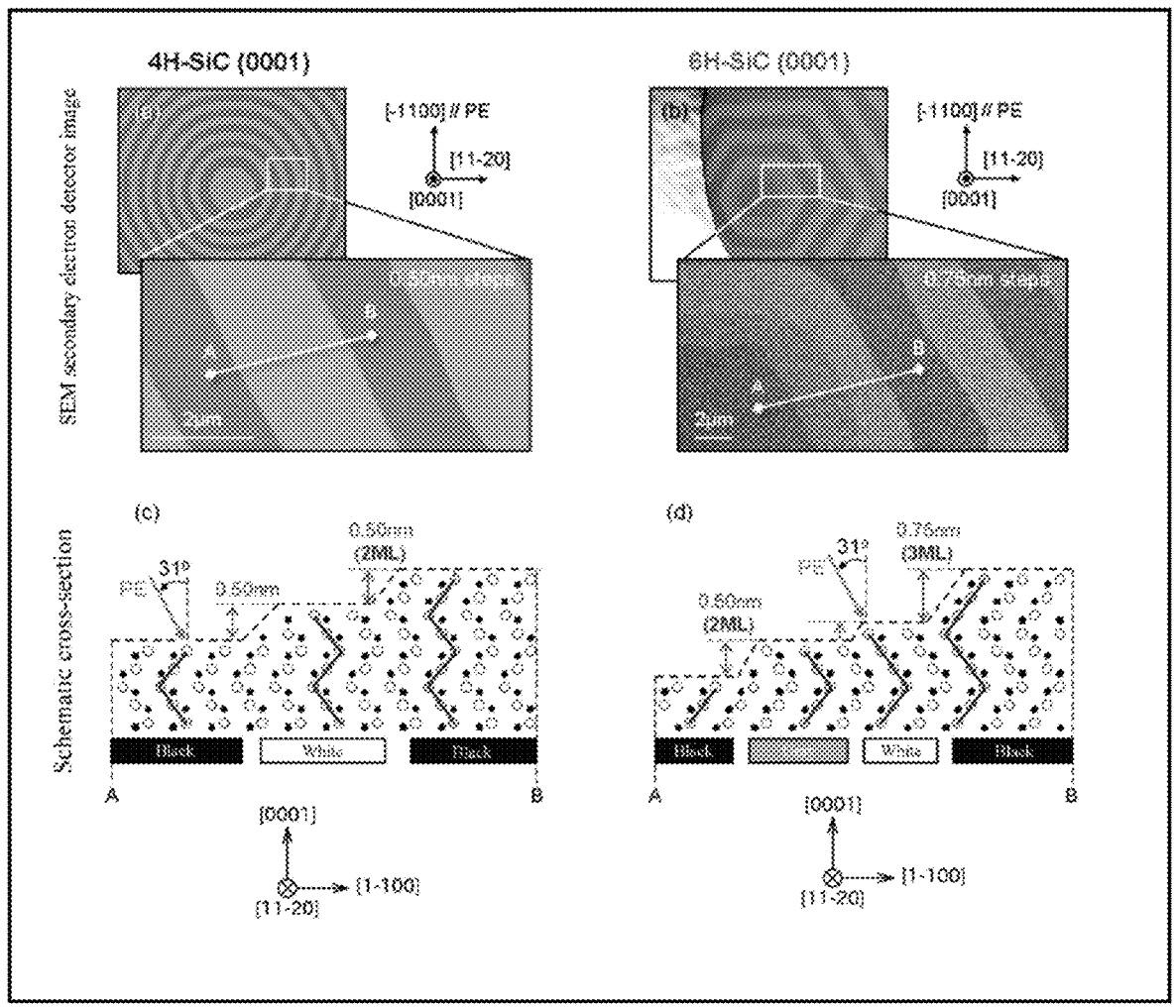
FIG. 9 is a schematic cross-sectional view containing SEM images obtained when a surface of 4H—SiC and a surface of 6H—SiC were observed.

FIG. 9 demonstrates that light and dark morphology in the shape of concentric circles appears also in 6H—SiC (0001), similar to in 4H—SiC (0001). According to the result of height analysis by an atomic force microscope (AFM), a boundary between a light region and a dark region was detected as being a three-molecular layer (0.75 nm) corresponding to a half unit of 6H—SiC. Thus, it can be found that the stack orientation directly under the surface in the light region is exactly opposite to that in the dark region. Consequently, it is found that contrast that reflects the stack orientations directly under the surface can be obtained also in 6H—SiC, which has a longer stack period than that of 4H—SiC.

Further, in addition to the light-dark contrast, a dim intermediate region can also be seen in 6H—SiC. Through the analysis by the AFM, it was detected that a boundary between the dim intermediate region and the light region corresponds to a step with one molecular layer height (0.25 nm). This indicates that while a light region or a dark region has a stack corresponding to a three-molecular layer, a dim intermediate region has a stack corresponding to only a two-molecular layer, which is the same as that in 4H—SiC. These results indicate that the contrast observed by the present technique reflects not only a difference in the stack orientations directly under the surface but also a depth difference corresponding to one molecular layer (0.25 nm), which is a difference between the stack of a two-molecular layer that appears in 4H—SiC and the stack of a three-molecular layer that appears in 6H—SiC.

Described below is a method for evaluating a scanning electron microscope and a SiC substrate using the reference sample 41 having the above-described characteristics.

As described above, the reference sample 41 has a uniform step/terrace structure made up of steps that each have a height corresponding to a half unit and terraces that each have a surface even in an atomic level in both cases where the reference sample 41 is made of 4H—SiC and of 6H—SiC, and there are two types of stack orientations directly under the terrace surfaces. Contrast that reflects the stack orientations directly under the surfaces can be observed by applying an electron beam with an inclination relative to a perpendicular to the reference sample 41.

Under the same electron beam incident conditions (including the incident electron angle θ, the sample rotation angle φ, and the acceleration voltage), the same contrast can be observed with a scanning electron microscope. Thus, a scanning electron microscope can be evaluated objectively by determining contrast with a high-precision scanning electron microscope in advance, for example, and comparing the contrast against contrast obtained with the scanning electron microscope to be evaluated.

More specifically, contrast intensity at the time of changing the incident electron angle θ with a high-precision scanning electron microscope is measured and data indicating the result is stored. After that, the reference sample 41 as well as the data is supplied to a predetermined user. The user can evaluate the performance (specifically, the parallelism of an electron beam and the performance indicating whether an electron beam is emitted in a predetermined direction) of a scanning electron microscope possessed by the user, by comparing the supplied data with results obtained by measuring the contrast intensity at the time of changing the incident electron angle θ with the scanning electron microscope possessed by the user.

As described above, the reference sample 41 exhibits different contrast intensities dependent on the depth corresponding to a turning position of a stack orientation directly under the surface. Thus, by measuring the reference sample 41 made of 4H—SiC in which stacking turns at the depth corresponding to a two-molecular layer (0.5 nm) from the surface and the reference sample 41 made of 6H—SiC in which stacking turns at the depth corresponding to a three-molecular layer (0.75 nm) from the surface and comparing the measurement results, the resolution of a scanning electron microscope at the depth corresponding to one molecular layer (0.25 nm) can be evaluated, which is equivalent to the difference between the two reference samples 41.

In addition, according to the present embodiment, terraces in 4H—SiC and 6H—SiC for the reference sample 41 are sufficiently wide for an incident electron beam and thus measurement can be performed without largely reducing the diameter of an electron beam. Accordingly, the acceleration voltage can be suppressed and as a result, information on the stack orientations directly under the surface, instead of those inside the reference sample 41, can be acquired more accurately.

A method for evaluating the quality of a SiC substrate is described below. As described above, contrast obtained when the incident electron angle θ is changed reflects the stack orientations directly under the surface. It is thus conceivable that, for example, if the terrace width is uniform or the surface is not even in an atomic level when electrons are incident at the incident electron angle θ expected to bring strong contrast, the boundaries of the contrast may fail to appear clearly or dark regions may be partially mixed in light regions. That is, the quality of a SiC substrate can be evaluated by detecting the state of the surface of the SiC substrate. In other words, the stack orientations directly under the terrace surfaces that cannot be detected with an AFM can be detected by the method according to the present embodiment.

As for a SiC substrate where a SiC cutout angle α is inclined with respect to the {0001} surface by approximately 1° to 8° and the terrace length that appears on the surface is exceedingly shorter than the terrace length of the reference sample, the quality of the SiC substrate can be evaluated as described below.

For example, if the SiC substrate has the cutout angle α of 1° to 8°, which is relative to the {0001} surface in [11-20] direction, and a surface covered with steps each having a half unit height is formed on the SiC substrate surface, a desired sharp contrast image cannot be obtained when observation is performed under conditions identical to those for an off substrate (that may also be referred to as an on substrate) with the off angle α of approximately 0° because the {0001} surface is inclined with respect to the SiC substrate surface in the [11-20] direction by the off angle α. In addition, the width of the terrace with a surface that is terminated only with the first stack orientation or the second stack orientation is ideally 29 nm or less in a case of 4H—SiC, or 43 nm or less in a case of 6H—SiC. It therefore is difficult by a conventional method to evaluate the quality of a SiC substrate using a difference in light and dark contrast.

Figure 10:
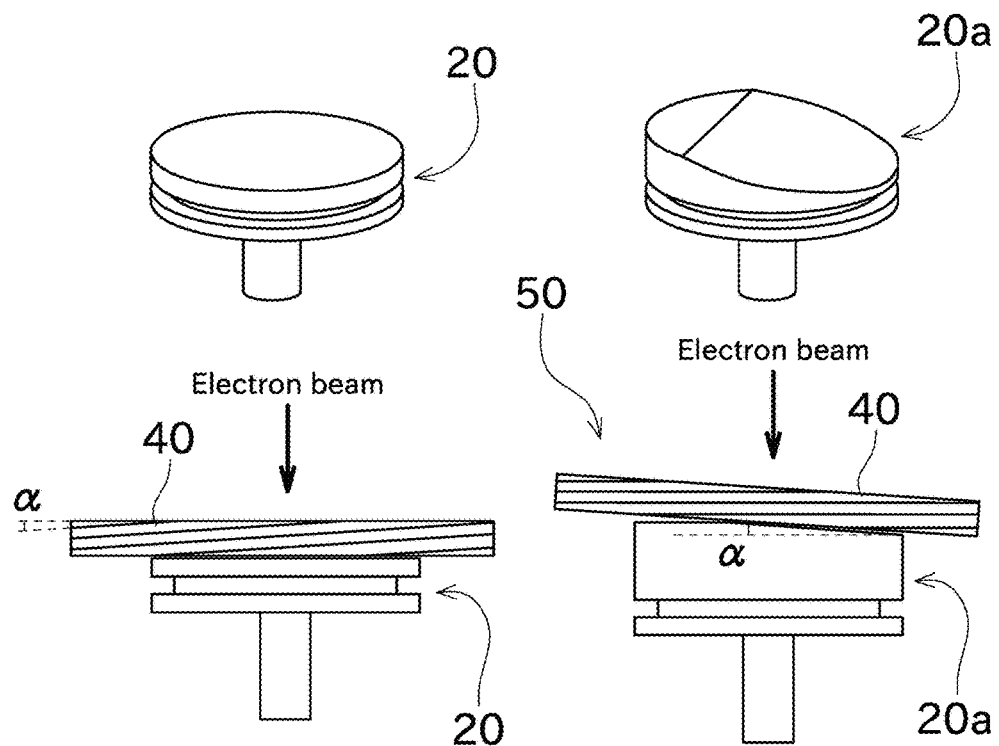
FIG. 10 is perspective views and cross-sectional views illustrating structures of inclined support bases for improving contrast of a SiC substrate having an off angle α.

In view of above, the present embodiment employs an inclined support base (correction stub) 20a as illustrated in FIG. 10 instead of the support base 20 having an even structure. A support surface of the inclined support base 20a includes a portion with an inclination angle that is approximately equal to the off angle of the SiC substrate 40 or the reference sample 41, and an even portion. Thus, a sharp contrast image can be acquired even under observation conditions identical to those for an on substrate. As a result, even when the SiC substrate includes a terrace with a short width, in-plane distributions of the terrace having the first stack orientation or the second stack orientation directly under the surface thereof can be clearly distinguished in both a macroscopic view and a microscopic view, and the quality of the SiC substrate can be evaluated.

Figure 11:
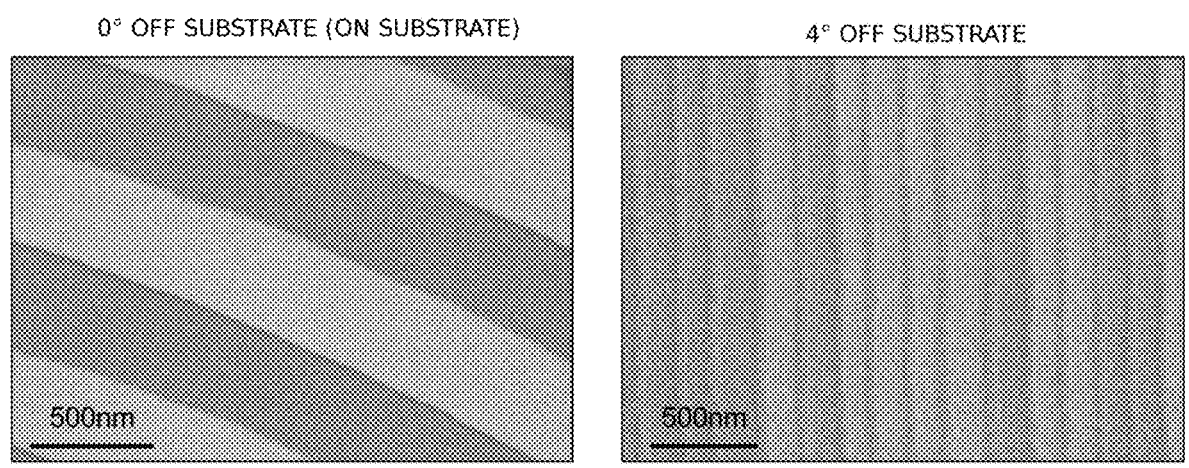
FIG. 11 is a diagram for comparison between contrast obtained by observing a SiC substrate with an off angle of approximately 0° using an even support base and contrast obtained by observing a SiC substrate with an off angle of 4°.
Figure 12:
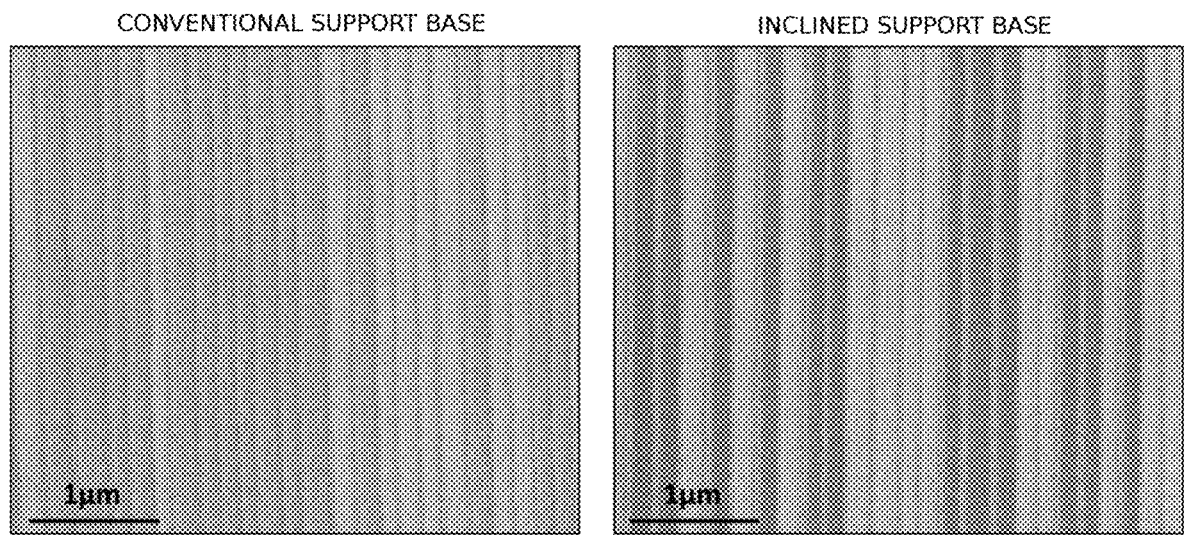
FIG. 12 is a diagram for comparison between contrast obtained by observing a SiC substrate with an off angle of 4° using an even support base and contrast obtained by observing a SiC substrate with an off angle of 4° using an inclined support base.

FIGS. 11 and 12 are diagrams showing results of an experiment conducted to see the effect of the inclined support base 20a. FIG. 11 is a diagram for comparison between contrast obtained by observing a SiC substrate with an off angle of approximately 0° using an even support base and contrast obtained by observing a SiC substrate with an off angle of 4°. As illustrated in FIG. 11, sharp contrast appeared when the off angle was approximately 0° while obscure contrast appeared when the off angle was 4°. Thus, as described above, it is difficult for the conventional support base 20 to evaluate the quality of a SiC substrate using a difference in light and dark contrast.

FIG. 12 is a diagram for comparison between contrast obtained by observing a SiC substrate with an off angle of 4° using the even support base 20 and contrast obtained by observing a SiC substrate with an off angle of 4° using the inclined support base 20a. As illustrated in FIG. 12, sharp contrast appeared when the inclined support base 20a was used while obscure contrast appeared when the even support base 20 was used.

Figure 13:
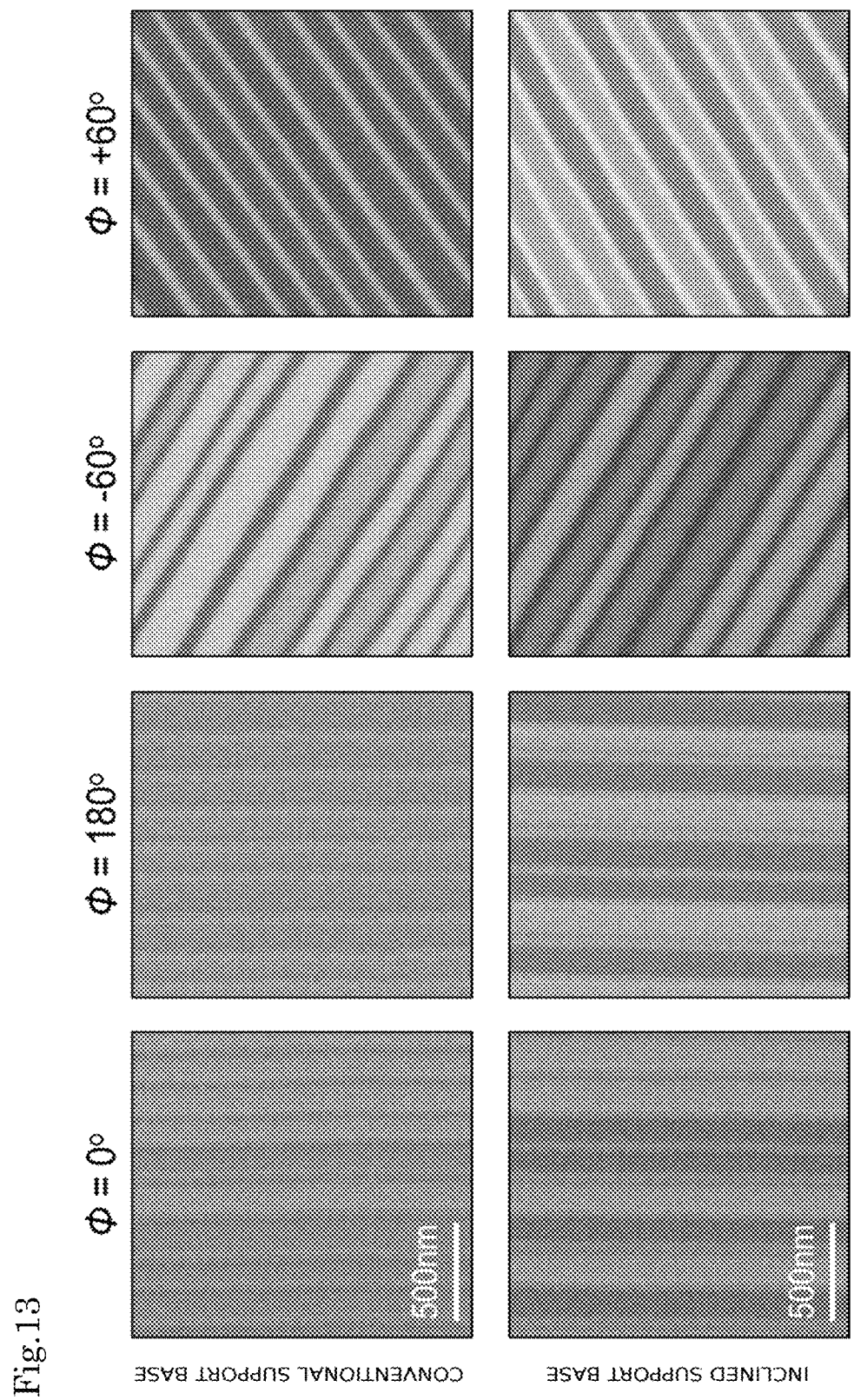
FIG. 13 is a diagram for comparison between contrast obtained in changing a sample rotation angle φ with an even support base supporting a SiC substrate with an off angle of 4° and contrast obtained in changing the sample rotation angle φ with an inclined support base supporting a SiC substrate with an off angle of 4°.

In view of the above-described results and the fact that contrast depends on the stack orientations, it is conceivable that even when the reference sample 41 has an off angle of 1° or more, use of the inclined support base 20a can bring contrast equivalent to those in the cases in FIGS. 7 to 9 (the cases in which the reference samples each having an off angle of approximately 0° are used). For example, FIG. 13 is a diagram for comparison between contrast obtained when the sample rotation angle φ is changed while the even support base 20 supports a SiC substrate having an off angle of 4° and contrast obtained when the sample rotation angle φ is changed while the inclined support base 20a supports a SiC substrate having an off angle of 4°. FIG. 13 indicates that even when the reference sample 41 with an off angle is used, contrast is clarified and three-fold symmetry is exhibited through use of the inclined support base 20a.

Thus, use of the inclined support base 20a enables the quality of a SiC substrate to be evaluated using difference in light-dark contrast even when the reference sample 41 with an off angle is used.

Specifically, the quality of the SiC substrate 40 can be evaluated by comparing in-plane distribution of brightness that is obtained by an electron beam being emitted from a scanning electron microscope to the reference sample 41 (the SiC substrate 40) at a predetermined incident electron angle using the inclined support base 20a and that is obtained from terraces having the first stack orientation and the second stack orientation directly under the surfaces thereof against in-plane distribution of brightness that is obtained by an electron beam being emitted at the same incident electron angle to the SiC substrate 40 to be evaluated.

As described above, a reference sample 50 with an inclined support base according to the present embodiment includes the reference sample 41 for evaluating the performance of a scanning electron microscope and the inclined support base 20a that supports the reference sample 41. The reference sample 41 is made of a hexagonal SiC single crystal, has an off angle, and has a step/terrace structure including a step with a half unit height and a terrace even in an atomic level, the step/terrace structure being formed on a surface of the reference sample 41, and a surface of each terrace has one of the first stack orientation and the second stack orientation. The support surface of the inclined support base 20a has an inclination angle identical to the off angle of the reference sample 41. Contrast as difference in lightness and darkness between an image of the terrace with the surface directly under which the first stack orientation lies and an image of the terrace with the surface directly under which the second stack orientation lies changes according to an incident electron angle irrespective of the off angle of the reference sample 41, where the incident electron angle is an angle that an electron beam emitted from a scanning electron microscope forms with respect to a perpendicular to the surface of the terrace.

The present embodiment also presents a method for evaluating accuracy relating to the direction of an electron beam that the scanning electron microscope 10 emits, the evaluation being implemented by comparing change in contrast obtained by an electron beam being emitted to the reference sample 41 while changing an incident electron angle against change in contrast determined in advance.

By the method, the scanning electron microscope 10 can be evaluated objectively. Additionally, SiC suffers few constraints on usage environment because of excellence in its resistance to heat and to oxidation and thus, a reference sample usable for a long period can be achieved.

Further, the present embodiment presents a method for evaluating the quality of a SiC substrate by comparing contrast obtained by an electron beam being emitted from the scanning electron microscope 10 to the reference sample 41 and contrast obtained by an electron beam being emitted to the SiC substrate to be evaluated.

Moreover, even in a case where a SiC substrate has the off angle α in a step/terrace structure formed on a surface of the SiC substrate and {0001} surface is inclined with respect to the substrate surface by the angle α so that no sharp contrast image can be obtained; use of the inclined support base 20a that corrects the off angle α makes it possible to obtain a sharp contrast image. Thus, the quality of the SiC substrate 40 can be evaluated by comparing in-plane distribution of brightness that is obtained by an electron beam being emitted from a scanning electron microscope to the reference sample 41 at a predetermined incident electron angle and that is obtained from terraces having the first stack orientation and the second stack orientation directly under the surfaces thereof against in-plane distribution of brightness that is obtained by an electron beam being emitted at the same incident electron angle to the SiC substrate 40 to be evaluated.

Accordingly, surface evenness and surface uniformity of a SiC substrate can be evaluated objectively.

While a preferred embodiment of the present invention is described above, the above-described configurations may be modified, for example, as follows.

FIG. 7 and the description above explain that contrast becomes highest when the incident electron angle θ is in the range from 30° to 31°. However, the range of the incident electron angle θ that provides the highest contrast varies depending on the acceleration voltage and a surface on which electrons are applied. A verification by the applicant reveals that, even if these conditions are changed, contrast is in principle highest when the incident electron angle θ is in the range from 30° to 40°.

The reference sample 41 described above may have any shape as long as the shape allows steps different in stack orientation to be formed.

Although the reference sample 41 whose surface is (0001) Si surface is described above, a reference sample 41 whose surface is (000-1) C surface can exert similar effects. Comparing results of measurement on both of these reference samples 41 enables evaluation of a difference between Si and C.

The reference sample 41 according to the present embodiment can serve to evaluate a scanning electron microscope with a configuration different from that of the scanning electron microscope 10 as long as the scanning electron microscope can change the incident electron angle θ.

The temperature, pressure, time, heater, and so on used in manufacturing the reference sample 41 may be chosen as desired.

REFERENCE SIGNS LIST

- 10 scanning electron microscope
- 20 support base
- 20a inclined support base
- 40 SiC substrate
- 41 reference sample (scanning electron microscope reference sample)
- 50 reference sample with inclined support base

The invention claimed is:

1. A method for evaluating a scanning electron microscope, the method comprising evaluating a performance relating to a direction of an electron beam that a scanning electron microscope emits, the evaluation being implemented by comparing change in a contrast obtained by an electron beam being emitted to a reference sample with an inclined support base while an incident electron angle is changed against a change in a predetermined contrast, wherein the reference sample includes:
the scanning electron microscope reference sample for evaluating the performance of the scanning electron microscope; and
the inclined support base that supports the scanning electron microscope reference sample, wherein the scanning electron microscope reference sample is made of a hexagonal SiC single crystal, has an off angle, and has a step/terrace structure including a step with a half unit height and a terrace even in an atomic level, the step/terrace structure being formed on a surface of the scanning electron microscope reference sample, wherein a surface of a first terrace has a first stack orientation and a surface of a second terrace has a second stack orientation, wherein a support surface of the inclined support base has an inclination angle identical to the off angle of the scanning electron microscope reference sample, wherein the predetermined contrast changes according to the incident electron angle irrespective of the off angle of the scanning electron microscope reference sample, where the predetermined contrast is a difference in lightness and darkness between an image of the first terrace with a surface directly under which the first stack orientation lies and an image of the second terrace with a surface directly under which the second stack orientation lies, and where the incident electron angle is an angle that the electron beam emitted from the scanning electron microscope forms with respect to a perpendicular to at least one of the surfaces of the first terrace and the second terrace.

2. The method according to claim 1, wherein
the predetermined contrast is highest when the incident electron angle is in a range from 30° to 40°.

3. The method according to claim 1, wherein
the predetermined contrast changes according to a sample rotation angle, where the sample rotation angle is an angle by which the scanning electron microscope reference sample is rotated about the perpendicular to the at least one surfaces of the first terrace and the second terrace.

4. The method according to claim 1, wherein
the step/terrace structure is in a shape of concentric circles or hexagons that increase in height outward from a center thereof by a half unit at a time.

5. The method according claim 1, wherein
a width of at least one of the first terrace and the second terrace is 0.1 μm or more and 20 μm or less.

6. The method according to claim 1, wherein
the step/terrace structure is made by: forming a depression in (0001) Si surface or (000-1) C surface of a surface of 4H—SiC or 6H—SiC substrate having the off angle; and heating the substrate under Si vapor pressure.

7. The method for evaluating the scanning electron microscope according to claim 1, wherein
a performance relating to a depth of the electron beam that the scanning electron microscope emits is evaluated by comparing an image obtained by the electron beam being emitted from the scanning electron microscope to the scanning electron microscope reference sample made of 4H—SiC against an image obtained by the electron beam being emitted from the scanning electron microscope to the scanning electron microscope reference sample made of 6H—SiC.

8. A method for evaluating a SiC substrate, the method comprising evaluating a quality of the SiC substrate by comparing a predetermined contrast obtained by an electron beam being emitted from a scanning electron microscope to a reference sample with an inclined support base against a contrast obtained by the electron beam being emitted to the SiC substrate to be evaluated,
   wherein the reference sample includes:
      the scanning electron microscope reference sample for evaluating a performance of the scanning electron microscope; and
      the inclined support base that supports the scanning electron microscope reference sample,
   wherein the scanning electron microscope reference sample is made of a hexagonal SiC single crystal, has an off angle, and has a step/terrace structure including a step with a half unit height and a terrace even in an atomic level, the step/terrace structure being formed on a surface of the scanning electron microscope reference sample,
   wherein a surface of a first terrace has a first stack orientation and a surface of a second terrace has a second stack orientation,
   wherein a support surface of the inclined support base has an inclination angle identical to the off angle of the scanning electron microscope reference sample,
   wherein the predetermined contrast changes according to an incident electron angle irrespective of the off angle of the scanning electron microscope reference sample, where the predetermined contrast is a difference in lightness and darkness between an image of the first terrace with a surface directly under which the first stack orientation lies and an image of the second terrace with a surface directly under which the second stack orientation lies,
   where the incident electron angle is an angle that the electron beam emitted from the scanning electron microscope forms with respect to a perpendicular to at least one of the surfaces of the first terrace and the second terrace,
   wherein the quality of the SiC substrate is evaluated by comparing in-plane distribution of brightness that is obtained by the electron beam being emitted from the scanning electron microscope to the reference sample at a predetermined incident electron angle and that is obtained from the first and second terraces with surfaces directly under which the first stack orientation and the second stack orientation lie against in-plane distribution of brightness that is obtained by the electron beam being emitted to the SiC substrate to be evaluated at an incident electron angle identical to the predetermined incident electron angle.

9. A method for evaluating a scanning electron microscope, the method comprising:
   evaluating a performance relating to a direction of an electron beam that a scanning electron microscope emits, the evaluation being implemented by comparing a change in a contrast obtained by the electron beam being emitted to a reference sample with an inclined support base while an incident electron angle is changed against a change in a predetermined contrast,
   wherein the reference sample includes:
      the scanning electron microscope reference sample for evaluating the performance of the scanning electron microscope; and
      the inclined support base that supports the scanning electron microscope reference sample,
   wherein the scanning electron microscope reference sample is made of a hexagonal SiC single crystal, has an off angle, and has a depression forming a step/terrace structure including a step with a half unit height and a terrace even in an atomic level, the step/terrace structure being formed on a surface of the scanning electron microscope reference sample,
   wherein a surface of at least one first terrace has a first stack orientation and a surface of at least one second terrace has a second stack orientation,
   wherein a support surface of the inclined support base has an inclination angle identical to the off angle of the scanning electron microscope reference sample, and
   wherein the predetermined contrast changes according to the incident electron angle irrespective of the off angle of the scanning electron microscope reference sample, where the predetermined contrast is a difference in lightness and darkness between an image of the first terrace with a surface directly under which the first stack orientation lies and an image of the second terrace with a surface directly under which the second stack orientation lies, and where the incident electron angle is an angle that an electron beam emitted from the scanning electron microscope forms with respect to a perpendicular to at least one surfaces of the first terrace and the second terrace.

10. The method for evaluating the scanning electron microscope according to claim 9, wherein
a performance relating to a depth of the electron beam that the scanning electron microscope emits is evaluated by comparing an image obtained by the electron beam being emitted from the scanning electron microscope to the scanning electron microscope reference sample made of 4H—SiC against an image obtained by the electron beam being emitted from the scanning electron microscope to the scanning electron microscope reference sample made of 6H—SiC.

11. A method for evaluating a SiC substrate, the method comprising:
   evaluating a quality of the SiC substrate by comparing a predetermined contrast obtained by an electron beam being emitted from a scanning electron microscope to a reference sample with an inclined support base against a contrast obtained by the electron beam being emitted to the SiC substrate to be evaluated,
   wherein the reference sample includes:
      the scanning electron microscope reference sample for evaluating a performance of the scanning electron microscope; and
      the inclined support base that supports the scanning electron microscope reference sample,
   wherein the scanning electron microscope reference sample is made of a hexagonal SiC single crystal, has an off angle, and has a depression forming a step/terrace structure including a step with a half unit height and a terrace even in an atomic level, the step/terrace structure being formed on a surface of the scanning electron microscope reference sample,
   wherein a surface of a first terrace has a first stack orientation and a surface of a second terrace has a second stack orientation, wherein a support surface of the inclined support base has an inclination angle identical to the off angle of the scanning electron microscope reference sample, wherein the predetermined contrast changes according to an incident electron angle irrespective of the off angle of the scanning electron microscope reference sample, where the predetermined contrast is a difference in lightness and darkness between an image of the first terrace with a surface directly under which the first stack orientation lies and an image of the second terrace with a surface directly under which the second stack orientation lies, and where the incident electron angle is an angle that the electron beam emitted from the scanning electron microscope forms with respect to a perpendicular to at least one surfaces first and the second terraces, and wherein the quality of the SiC substrate is evaluated by comparing in-plane distribution of brightness that is obtained by the electron beam being emitted from the scanning electron microscope to the reference sample at a predetermined incident electron angle and that is obtained from the first and second terraces with surfaces directly under which the first stack orientation and the second stack orientation lie against in-plane distribution of brightness that is obtained by the electron beam being emitted to the SiC substrate to be evaluated at an incident electron angle identical to the predetermined incident electron angle.

* * * * *